(12) United States Patent
Park

(10) Patent No.: US 9,448,461 B2
(45) Date of Patent: Sep. 20, 2016

(54) LIGHT CONVERSION MEMBER AND DISPLAY DEVICE HAVING THE SAME

(75) Inventor: Seung Ryong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 228 days.

(21) Appl. No.: 14/006,637

(22) PCT Filed: Mar. 21, 2012

(86) PCT No.: PCT/KR2012/002022
§ 371 (c)(1),
(2), (4) Date: Sep. 20, 2013

(87) PCT Pub. No.: WO2012/128552
PCT Pub. Date: Sep. 27, 2012

(65) Prior Publication Data
US 2014/0009820 A1    Jan. 9, 2014

(30) Foreign Application Priority Data
Mar. 22, 2011  (KR) .......................... 10-2011-0025530

(51) Int. Cl.
| | |
|---|---|
| G02F 1/35 | (2006.01) |
| G02F 1/1335 | (2006.01) |
| F21V 8/00 | (2006.01) |
| H01L 33/50 | (2010.01) |
| G02F 1/017 | (2006.01) |

(52) U.S. Cl.
CPC ............. *G02F 1/353* (2013.01); *G02B 6/0023* (2013.01); *G02F 1/1336* (2013.01); *G02B 6/009* (2013.01); *G02F 1/133615* (2013.01); *G02F 2001/01791* (2013.01); *G02F 2001/133614* (2013.01); *H01L 33/507* (2013.01)

(58) Field of Classification Search
None
See application file for complete search history.

(56) References Cited

U.S. PATENT DOCUMENTS

| | | | |
|---|---|---|---|
| 5,959,316 A | 9/1999 | Lowery | |
| 7,819,539 B2 | 10/2010 | Kim et al. | |
| 8,080,436 B2 | 12/2011 | Sugiyama | |
| 8,164,825 B2 | 4/2012 | Narendran et al. | |
| 2007/0081329 A1 | 4/2007 | Chua et al. | |
| 2008/0094829 A1* | 4/2008 | Narendran et al. | ........... 362/231 |
| 2008/0210966 A1* | 9/2008 | Sakamoto | ............... H01L 33/46 257/98 |
| 2008/0231170 A1* | 9/2008 | Masato et al. | ................. 313/501 |
| 2010/0182532 A1 | 7/2010 | Lin et al. | |
| 2010/0193806 A1 | 8/2010 | Byun | |
| 2011/0309325 A1* | 12/2011 | Park et al. | ...................... 257/13 |

(Continued)

FOREIGN PATENT DOCUMENTS

| | | |
|---|---|---|
| CN | 1874019 A | 12/2006 |
| CN | 1908762 A | 2/2007 |

(Continued)

*Primary Examiner* — Hemang Sanghavi
(74) *Attorney, Agent, or Firm* — Birch, Stewart, Kolasch & Birch, LLP

(57) ABSTRACT

Disclosed are a light conversion member and a display device having the same. The display device includes a light source, and a light conversion member adjacent to the light source. The light conversion member includes a plurality of light conversion particles to convert a wavelength of a light emitted from the light source, and a sealing member to receive the light conversion particles. The sealing member includes an incident part facing an exit surface of the light source, an exit part facing the incident part while the light conversion particles are interposed between the exit part and the incident part, and a reflection part connected to the incident part and the exit part.

15 Claims, 4 Drawing Sheets

(56) References Cited

U.S. PATENT DOCUMENTS

2012/0106127 A1* 5/2012 Hattori et al. .................. 362/84
2013/0063964 A1* 3/2013 Meir et al. .................... 362/555

FOREIGN PATENT DOCUMENTS

| | | |
|---|---|---|
| CN | 101611500 A | 12/2009 |
| EP | 2 214 218 A2 | 8/2010 |
| JP | 2009-200534 A | 9/2009 |
| JP | 2010-232203 A | 10/2010 |
| JP | 2011-35187 A | 2/2011 |
| KR | 10-2009-0082497 A | 7/2009 |
| KR | 10-2010-0046698 A | 5/2010 |
| TW | 201028771 A | 8/2010 |
| WO | WO 2008/060335 A1 | 5/2008 |

\* cited by examiner

LIGHT CONVERSION MEMBER AND DISPLAY DEVICE HAVING THE SAME

TECHNICAL FIELD

The embodiment relates to a light conversion member and a display device having the same.

BACKGROUND ART

A light emitting diode (LED) is a semiconductor device that converts electricity into ultraviolet ray, visible ray or infrared ray by using characteristics of compound semiconductors. The LED is mainly used for home appliances, remote controllers and large-size electric signboards.

A high-brightness LED is used as a light source for a lighting device. Since the LED represents the superior energy efficiency and long life span, the replacement cost thereof may be reduced. In addition, the LED is strong against vibration and impact and it is not necessary to use toxic substances, such as Hg, so the LED substitutes for a glow lamp and a fluorescent lamp in terms of energy saving, environmental protection and cost reduction.

In addition, the LED may be advantageously used as a light source for a middle-size or large-size LCD TV and a monitor. When comparing with a cold cathode fluorescent lamp (CCFL) mainly used in a liquid crystal display (LCD), the LED represents superior color purity and low power consumption and can be fabricated in a small size, so various products equipped with the LED have been produced and studies for the LED have been actively performed.

Recently, a plurality of technologies are introduced to realize white light by employing a blue LED and using quantum dots to emit red and green light as a fluorescence substance. This is because the white light realized by using the quantum dots represents high brightness and superior color reproduction.

However, there still remains the requirement for researches and studies to reduce light loss and improve color uniformity when the LED is applied to a backlight unit.

DISCLOSURE OF INVENTION

Technical Problem

The embodiment provides a light conversion member and a display device, capable of representing high image quality with uniform color reproduction.

Solution to Problem

According to one embodiment, a display device includes a light source, and a light conversion member adjacent to the light source.

In this case, the light conversion member includes a plurality of light conversion particles to convert a wavelength of a light emitted from the light source, and a sealing member to receive the light conversion particles. The sealing member includes an incident part facing an exit surface of the light source, an exit part facing the incident part while the light conversion particles are interposed between the exit part and the incident part, and a reflection part connected to the incident part and the exit part.

According to one embodiment, a display device includes a light source, and a light conversion member having a groove corresponding to the light source and converting a wavelength of a light emitted from the light source.

According to one embodiment, a display device includes a light guide plate, a light source at one side of the light guide plate, and a light conversion member between the light source and the light guide plate. The light source emits a first light, the light conversion member transmits a part of the first light and converts another part of the first light into second and third lights, and half-intensity angles of the first, second, and third lights, which are output from the light conversion member, correspond to each other in a direction perpendicular to a top surface of the light guide plate.

Advantageous Effects of Invention

The light emitting member according to the embodiment can guide emitted light through the reflection part. In other words, the light incident through the incident part can be emitted through the output part at a predetermined divergence angle obtained by the reflection part.

In particular, the light having the wavelength converted by the light conversion particles can be output at a predetermined divergence angle obtained by the reflection part. In other words, the light emitted from the light source and the light having the converted wavelength can be output at the same divergence angle by the reflection part.

Therefore, the light conversion member according to the embodiment can output a light by uniformly mixing lights having different wavelengths with each other.

For example, when the light source emits blue light, the light conversion particles can convert the blue light into green light and red light. In this case, the blue light, the green light, and the red light can be emitted through the output part with the same divergence angle obtained by the reflection part.

Therefore, the display device according to the embodiment can display an image by using white light obtained by uniformly mixing the blue light, the green light, and the red light with each other.

As described above, the light conversion member and the display device according to the embodiment can represent uniform color reproduction by employing the reflection part.

MODE FOR THE INVENTION

Figure 1:
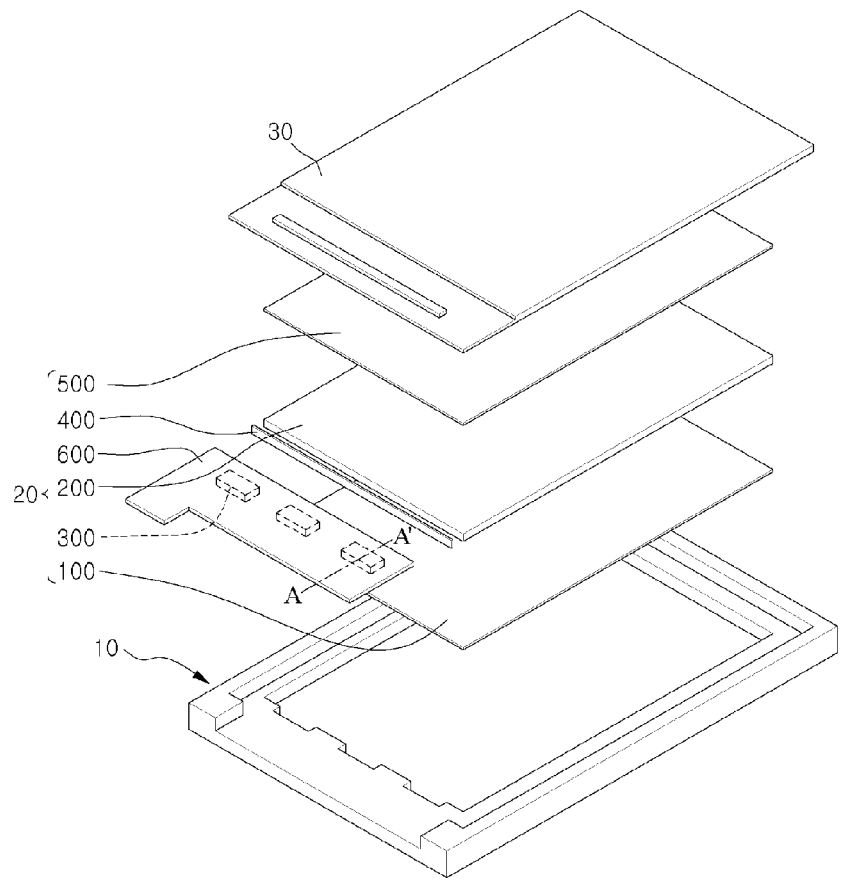
FIG. 1 is an exploded perspective view showing a liquid crystal display according to a first embodiment.

In the description of the embodiments, it will be understood that when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Figure 2:
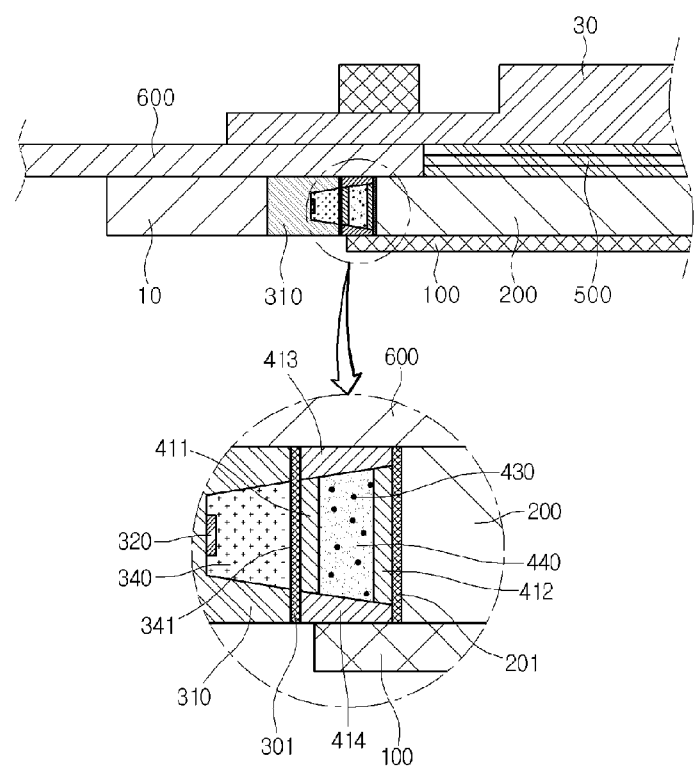
FIG. 2 is a sectional view showing a portion of the liquid crystal display according to the first embodiment.
Figure 3:
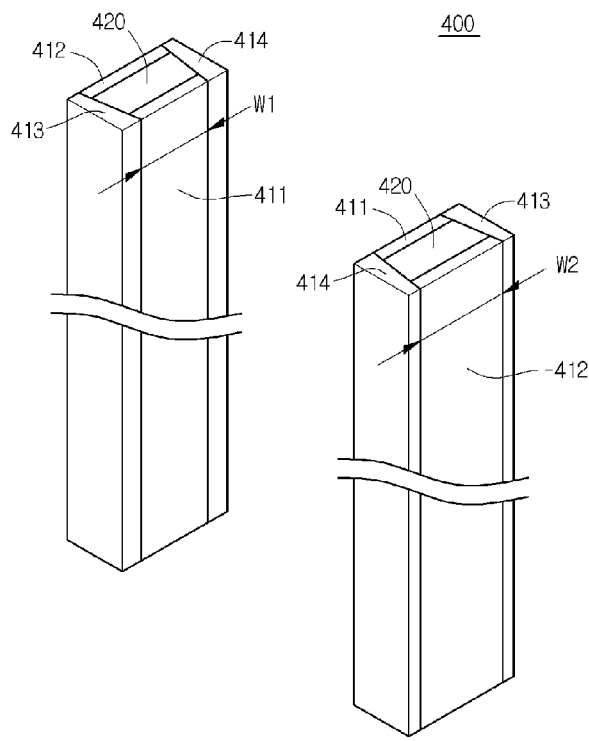
FIG. 3 illustrates perspective views showing a surface facing an LED of the light conversion member and a surface facing a light guide plate.
Figure 4:
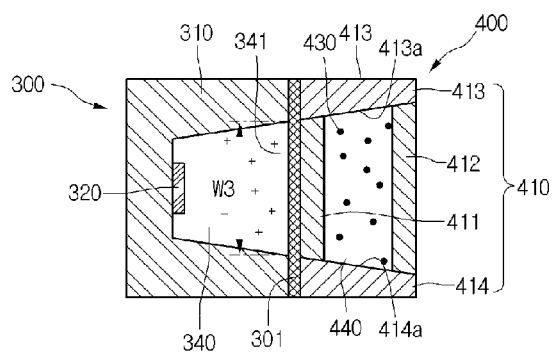
FIG. 4 is a sectional view showing portions of the LED and the light conversion member.
Figure 5:
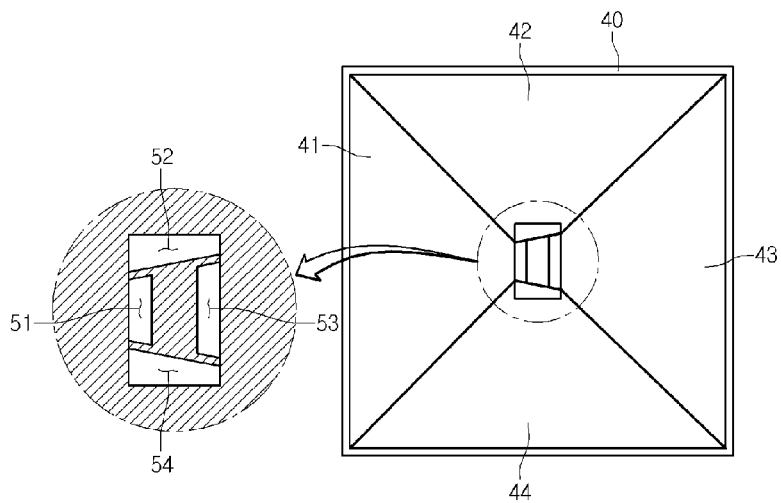
FIGS. 5 to 7 are views showing a method for fabricating the light conversion member according to the first embodiment.
Figure 6:
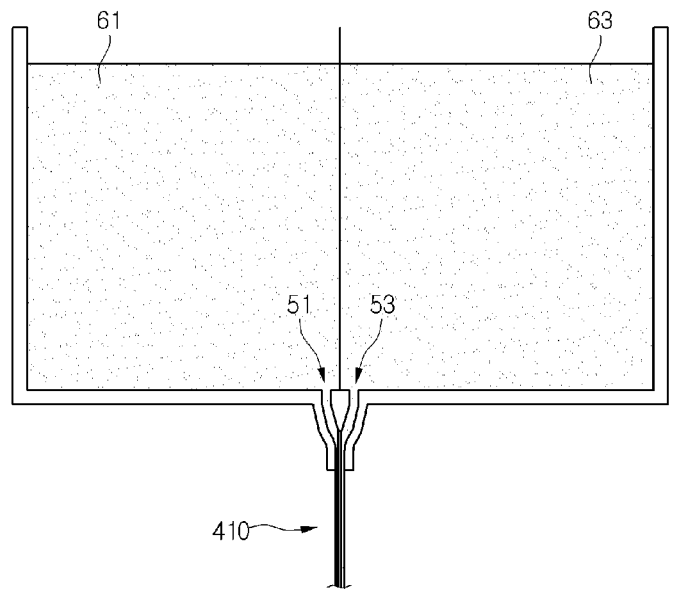
Figure 7:
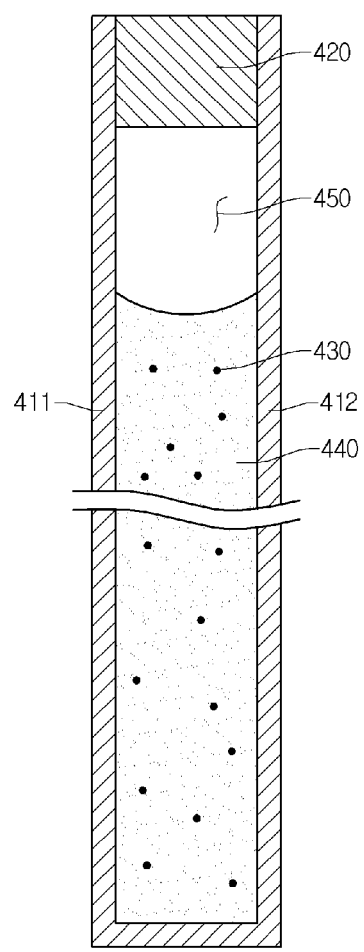

FIG. 1 is an exploded perspective view showing a liquid crystal display according to a first embodiment. FIG. 2 is a sectional view showing a portion of the liquid crystal display according to the first embodiment. FIG. 3 illustrates perspective views showing a surface facing an LED of the light conversion member and a surface facing a light guide plate. FIG. 4 is a sectional view showing portions of the LED and the light conversion member. FIGS. 5 to 7 are views showing a method for fabricating the light conversion member according to the first embodiment.

Referring to FIGS. 1 to 4, the liquid crystal display according to the embodiment includes a mold frame 10, a backlight assembly 20, and a liquid crystal panel 30.

The mold frame 10 receives the backlight assembly 20 and the liquid crystal panel 30 therein. The mold frame 10 has the shape of a rectangular frame. For example, the mold frame 10 may include plastic or enhanced plastic.

In addition, a chassis may be provided under the mold frame 10 to surround the mold frame 10 while supporting the backlight assembly 20. The chassis may be provided at the lateral sides of the mold frame 10.

The backlight assembly 20 is provided inside the mold frame 10, and generates a light to emit toward the liquid crystal panel 30. The backlight assembly 20 includes a reflective sheet 100, a light guide plate 200, a light emitting diode 300, a light conversion member 400, a plurality of optical sheets 500 and a flexible printed circuit board (FPCB) 600.

The reflective sheet 100 reflects light emitted from the light emitting diode 300 upward.

The light guide plate 200 is provided above the reflective sheet 100. The light guide plate 200 receives light emitted from the light emitting diode 300 to reflect the light upward through reflection, refraction, and scattering.

The light guide plate 200 has an incident surface facing the light emitting diode 300. In other words, a surface of the light guide plate 200 facing the light emitting diode 300 is the incident surface.

The light guide diode 300 is provided at a lateral side of the light guide plate 200. In detail, the light emitting diode 300 is provided at the light incident surface.

Referring to FIG. 4, the light emitting diode 300 may include a body 310, a light emitting diode chip 320, a lead electrode (not shown), and a filling material 340.

The body 310 is provided therein with a cavity. The cavity may receive the light emitting diode chip 320 and the filling material 340. The body 310 may include plastic. The inner lateral side of the cavity may be coated with a reflective layer (not shown) to reflect a light emitted from the light emitting diode chip 320.

The light emitting diode chip 320 is provided inside the cavity. The light emitting diode chip 320 receives an electrical signal through the lead electrode to generate a light. The light emitting diode chip 320 is electrically connected to the lead electrode.

The filling material 340 surrounds the light emitting diode chip 320. The filling material 340 may be filled in the cavity. The filling material 340 is transparent. An exposed outer surface 341 of the filling material 340 serves as a light exit surface 341 to emit light. The light exit surface 341 may be a flat surface or a curved surface.

The lead electrode is connected to the light emitting diode chip 320. In addition, the lead electrode is electrically connected to the FPCB 600. The lead electrode and the body 310 may be formed through an injection process.

The light emitting diode 300 serves as a light source to generate light. In detail, the light emitting diode 300 emits light toward the light conversion member 400.

The light emitting diode 300 may include a blue light emitting diode 300 to emit blue light or an UV light emitting diode 300 to emit ultra-violet light. In other words, the light emitting diode 300 may emit blue light having a wavelength band of about 430 nm to about 470 nm, and may emit ultra-violet light having a wavelength band of about 300 nm to about 400 nm.

The light emitting diode 300 is mounted on the FPCB 600. The light emitting diode 300 is mounted on a bottom surface of the FPCB 600. The light emitting diode 300 receives a driving signal through the FPCB 600.

The light conversion member 400 is interposed between the light emitting diode 300 and the light guide plate 200. The light conversion member 400 adheres to the lateral side of the light guide plate 200. In detail, the light conversion member 400 is attached to the incident surface of the light guide plate 200. In addition, the light conversion member 400 may adhere to the light emitting diode 300.

The light conversion member 400 receives light emitted from the light emitting diode 300 to change the wavelength of the light. For example, the light conversion member 400 may change the blue light emitted from the light emitting diode 300 to green light and red light. In other words, the light conversion member 400 may change a part of the blue light into the blue light having a wavelength band of about 520 nm to about 560 nm, and changes another part of the blue light to the red light having a wavelength band of about 630 nm to about 660 nm. In addition, the light conversion member 400 transmits another part of the blue light without changing the blue light.

In addition, the light conversion member 400 may convert the UV light emitted from the light emitting diodes 300 into the blue light, the green light and the red light. In detail, the light conversion member 400 may convert a part of the UV light into the blue light having the wavelength of about 430 nm to about 470 nm, another part of the UV light into the green light having the wavelength of about 520 nm to about 560 nm, and another part of the UV light into the red light having the wavelength of about 630 nm to about 660 nm.

Therefore, the white light can be generated by the light passing through the light conversion member 400 and the lights converted by the light conversion member 400. In detail, the white light can be incident into the light guide plate 200 through the combination of the blue light, the green light and the red right.

As shown in FIGS. 3 and 4, the light conversion member 400 includes a tube 410, a sealing part 420, a plurality of light conversion particles 430, and a host 440.

The tube 410 receives the sealing part 420, the light conversion particles 430 and the host 440 therein. That is, the tube 410 may serve as a receptacle to receive the sealing part 420, the light conversion particles 430 and the host 440. In addition, the tube 410 extends in one direction with a long length.

The tube 410 may have the shape of a rectangular tube. In detail, a section of the tube 410, which is vertical to the length direction of the tube 410, may have the rectangular shape. The tube 410 may have a width of about 0.6 mm and a height of about 0.2 mm. In other words, the tube 410 may include a capillary tube.

The tube 410 includes an incident part 411, an exit part 412, a first reflection part 413, and a second reflection part 414.

The incident part 411 corresponds to the light emitting diode 300. The incident part 411 is adjacent to the light exit surface 341 of the light emitting diode 300. The incident part 411 is provided in opposition to the light exit surface 341 of the light emitting diode.

The incident part 411 extends in the extension direction of the tube 410. The incident part 411 may have a width W1 corresponding to a width W3 of the light incident surface 341 of the light emitting diode 300. In other words, the width W1 of the incident part 411 may be substantially identical to the width W3 of the light exit surface 341 of the light emitting diode 300.

The incident part 411 is transparent. The incident part 411 may have a refractive index different from that of the exit part 412. The refractive index of the incident part 411 may have intermediate values between the refractive indexes of the filling material 340 and the host 440.

The exit part 412 corresponds to the light guide plate 200. The exit part 412 is adjacent to the light incident surface of the light guide plate 200. The exit part 412 is provided in opposition to the light incident surface of the light guide plate 200.

In addition, the incident part 411 is provided in opposition to the exit part 412. The host 440 is interposed between the incident part 411 and the exit part 412. In addition, the light conversion particles 430 are provided between the incident part 411 and the exit part 412. In other words, the incident part 411 faces the exit part 412 while interposing the host 440 and the light conversion particles 430 therebetween.

The exit part 412 may extend in the extension part of the tube 410. The exit part 412 may have a width W2 greater than the width W1 of the incident part 411.

The exit part 412 is transparent. The exit part 412 may have a refractive index different from that of the incident part 411. The refractive index of the exit part 412 may have the intermediate value between the refractive indexes of the light guide plate 20 and the incident part 411.

The first reflection part 413 is provided on both the incident part 411 and the exit part 412. The first reflection part 413 is provided on the host 440. In addition, the first reflection part 413 is provided between the light conversion particles 430. The first reflection part 413 is interposed between the incident part 411 and the exit part 412. As a result, the incident part 411, the exit part 412, and the first reflection part 413 surround the light conversion particles 430.

In addition, the first reflection part 413 is connected to the incident part 411 and the exit part 412. In detail, the first reflection part 413 is connected to an upper end of the incident part 411 and an upper end of the exit part 412. In other words, the first reflection part 413 extends from the upper end of the indent part 411 to the upper end of the exit part 412.

The first reflection part 413 has a first inclined surface 413a inclined with respect to an optical axis of the light emitting diode 300. The first inclined surface 413a is inclined with respect to the incident part 411 and the exit part 412. The first inclined surface 413a may directly make contact with the host 440. In other words, the first inclined surface 413a is a part of an inner surface of the tube 410. In addition, the angle between the first inclined surface 313a and the optical axis of the light emitting diode 300 may be in the range of about 30° to about 60°

The second reflection part 414 is provided under the incident part 411 and the exit part 412. The second reflection part 414 is provided under the host 440. The second reflection part 414 is provided under the light conversion particles 430. The first reflection part 413 is interposed between the incident part 411 and the exit part 412. Accordingly, the incident part 411, the exit part 412, the first reflection part 413, and the second reflection part 414 surround the light conversion particles 430.

In addition, the second reflection part 414 is connected to the incident part 411 and the exit part 412. In detail, the second reflection part 414 is connected to a lower end of the incident part 411 and a lower end of the exit part 412. In other words, the second reflection part 414 extends from the lower end of the incident part 411 to the lower end of the exit part 412.

The second reflection part 414 has a second inclined surface 414a inclined with respect to an optical axis of the light emitting diode 300. The second inclined surface 414a is inclined with respect to the incident part 411 and the exit part 412. The second inclined surface 414a may directly make contact with the host 440. In other words, the first inclined surface 414a is another part of an inner surface of the tube 410. In addition, the angle between the second inclined surface 414a and the optical axis of the light emitting diode 300 may be in the range of about 30° to about 60°

In addition, the first and second reflection parts 413 and 414 may extend in the extension direction of the tube 410. In other words, the first and second reflection parts 413 and 414 may extend in the same extension direction of the exit part 412.

The first and second reflection parts 413 and 414 have transmittance lower than that of the incident part 411 and the exit part 412. For example, the first and second reflection parts 413 and 414 may be semitransparent or opaque. The first and second reflection parts 413 and 414 may include white glass.

In addition, the first and second reflection parts 413 and 414 include color dyes or color pigments. In detail, the color dyes or the color pigments may be white or blue. For example, the color pigments may include titanium oxide.

The first and second reflection parts 413 and 414 reflect lights. In detail, the first and second reflection parts 413 and 414 may reflect lights (converted lights) which are converted by the light conversion particles 430. The first and second reflection parts 413 and 413 may reflect lights (transmitted lights) which are transmitted without the conversion by the light conversion particles 430.

Therefore, the paths of the converted and transmitted lights may be changed by the first and second reflection parts 413 and 414. The divergence angles of the converted and transmitted lights can be adjusted by the first and second reflection parts 413 and 414.

For example, the path of the converted light can be adjusted by the first and second reflection parts 413 and 414 so that the path of the converted light can be closed to the optical axis of the light emitting diode 300. As a result, the divergence angle of the converted light is adjusted by the first and second reflection parts 413 and 414 so that that the divergence angle of the converted light can be equal to or approximate a lower divergence angle of the transmitted light.

The incident part 411, the exit part 412, the first reflection part 413, and the second reflection part 414 may be integrally formed with each other. In addition, the incident part 411, the exit part 412, the first reflection part 413, and the second reflection part 414 may include glass or plastic.

The sealing part 420 is provided in the tube 410. The sealing part 420 is provided at an end portion of the tube 410. The sealing part 410 seals the inner part of the tube 410. The sealing part 420 may include epoxy resin.

The tube 410 and the sealing part 420 isolate the light conversion particles 430 and the host 440 from the outside. In other words, the tube 410 and the sealing part 420 serve as a sealing member to receive the light conversion particles 430 and to seal the light conversion particles 430 from the outside.

The light conversion particles 430 are contained in the tube 410. In detail, the light conversion particles 430 are uniformly dispersed in the host 440, and the host 440 is provided in the tube 410.

The light conversion particles 430 convert wavelengths of lights emitted from the light emitting diode 300. The light conversion particles 430 receive the light emitted from the light emitting diode 300 to convert the wavelengths of the light. For instance, the light conversion particles 430 may convert the blue light emitted from the light emitting diodes 300 into the green light and the red light. That is, a part of the light conversion particles 430 may convert the blue light into the green light having the wavelength of about 520 nm to about 560 nm and another part of the light conversion particles 430 converts the blue light into the red light having the wavelength of about 630 nm to about 660 nm.

In addition, the light conversion particles 430 can convert the UV light emitted from the light emitting diodes 300 into the blue light, the green light and the red light. That is, a part of the light conversion particles 430 converts the UV light into the blue light having the wavelength in the range of about 430 nm to about 470 nm, and another part of the light conversion particles 430 converts the UV light into the green light having the wavelength in the range of about 520 nm to about 560 nm. Further, a part of the light conversion particles 430 converts the UV light into the red light having the wavelength in the range of about 630 nm to about 660 nm.

In other words, if the light emitting diodes 300 are blue light emitting diodes that emit the blue light, the light conversion particles 430 capable of converting the blue light into the green light and the red light may be employed. In addition, if the light emitting diodes 300 are UV light emitting diodes that emit the UV light, the light conversion particles 430 capable of converting the UV light into the blue light, the green light and the red light may be employed.

The light conversion particles 430 may include a plurality of quantum dots. The quantum dots may include core nano-crystals and shell nano-crystals surrounding the core nano-crystals. In addition, the quantum dots may include organic ligands bonded to the shell nano-crystals. In addition, the quantum dots may include an organic coating layer surrounding the shell nano-crystals.

The shell nano-crystals may be prepared as at least two layers. The shell nano-crystals are formed on the surface of the core nano-crystals. The quantum dots can lengthen the wavelength of the light incident into the core nano-crystals by using the shell nano-crystals forming a shell layer, thereby improving the light efficiency.

The quantum dots may include at least one of a group-II compound semiconductor, a group-III compound semiconductor, a group-V compound semiconductor, and a group-VI compound semiconductor. In detail, the core nano-crystals may include Cdse, InGaP, CdTe, CdS, ZnSe, ZnTe, ZnS, HgTe or HgS. In addition, the shell nano-crystals may include CuZnS, CdSe, CdTe, CdS, ZnSe, ZnTe, ZnS, HgTe or HgS. The quantum dot may have a diameter of about 1 nm to about 10 nm.

The wavelength of the light emitted from the quantum dots can be adjusted according to the size of the quantum dot or the molar ratio between the molecular cluster compound and the nano-particle precursor in the synthesis process. The organic ligand may include pyridine, mercapto alcohol, thiol, phosphine and phosphine oxide. The organic ligand may stabilize the unstable quantum dots after the synthesis process. Dangling bonds may be formed at the valence band and the quantum dots may be unstable due to the dangling bonds. However, since one end of the organic ligand is in the non-bonding state, one end of the organic ligand is bonded with the dangling bonds, thereby stabilizing the quantum dots.

In particular, if the size of the quantum dot is smaller than the Bohr radius of an exciton, which consists of an electron and a hole excited by lights and electricity, the quantum confinement effect may occur, so that the quantum dot may have the discrete energy level. Thus, the size of the energy gap is changed. In addition, the charges are confined within the quantum dot, so that the light emitting efficiency can be improved.

Different from general fluorescent pigments, the fluorescent wavelength of the quantum dot may vary depending on the size of the particles. In detail, the light has the shorter wavelength as the size of the particle becomes small, so the fluorescent light having the wavelength band of visible ray can be generated by adjusting the size of the particles. In addition, the quantum dot represents the extinction coefficient, which is 100 to 1000 times higher than that of the general fluorescent pigment, and has the superior quantum yield as compared with the general fluorescent pigment, so that that strong fluorescent light can be generated.

The quantum dots can be synthesized through the chemical wet scheme. The chemical wet scheme is to grow the particles by immersing the precursor material in the organic solvent. According to the chemical wet scheme, the quantum dots can be synthesized.

The host 440 surrounds the light conversion particles 430. In detail, the light conversion particles 430 are uniformly distributed in the host 440. The host 440 includes polymer. The host 440 is transparent. That is, the host 440 may include transparent polymer.

The host 440 is disposed in the tube 410. In detail, the host 440 is fully filled in the tube 410. The host 440 may adhere to an inner surface of the tube 410.

An air layer 450 is formed between the sealing part 420 and the host 440. The air layer 450 is filled with nitrogen. The air layer 450 performs the damping function between the sealing part 420 and the matrix 440.

The optical sheets 500 are provided on the light guide plate 200. The optical sheets 500 improve the characteristic of the transmitted light.

The FPCB 600 is electrically connected to the light emitting diodes 300. The FPCB 600 can mount the light emitting diodes 300 thereon. The FPCB 600 is installed in the mold frame 10 and arranged on the light guide plate 200.

The mold frame 10 and the backlight assembly 20 constitute the backlight unit. That is, the backlight unit includes the mold frame 10 and the backlight assembly 20.

The liquid crystal panel 30 is provided inside the mold frame 10, and provided on the optical sheets 500.

The liquid crystal panel 30 displays images by adjusting intensity of the light passing through the liquid crystal panel 30. That is, the liquid crystal panel 30 is a display panel to display the images. The liquid crystal panel 30 includes a TFT substrate, a color filter substrate, a liquid crystal layer interposed between the above two substrates and polarizing filters.

As described above, the divergence angles of the converted and transmitted lights can be easily controlled by the first and second reflection parts 413 and 414. Therefore, the light conversion member 400 can represent white light having high color reproduction formed by uniformly mixing the red light, the green light, and the blue light. In other words, the light conversion member 400 makes divergence angles of the blue light, the red light, and the green light equal to each other, thereby preventing only both of the red light and the green light from being irradiated onto a predetermined region without the irradiation of the blue light.

Therefore, the red light, the green light, and the blue light emitted from the light conversion member 400 may have divergence angles corresponding to each other. In other words, the red light, the green light, and the blue light emitted from the light conversion member 400 may have divergence angles substantially equal to each other.

For example, the red light, the green light, and the blue light emitted from the light conversion member 400 may have half-intensity angles corresponding to each other in upper and lower directions. In detail, the red light, the green light, and the blue light emitted from the light conversion member 400 may have half-intensity angles in the range of about ±40° to about ±70° in upper and lower directions. In more detail, the half-intensity angles in the upper and lower directions may be about ±60°. In this case, the upper and lower directions refer to directions perpendicular to the top surface of the light guide plate.

Therefore, the liquid crystal display according to the embodiment may have uniform color reproduction, enhanced brightness, and enhanced image quality throughout the entire portion thereof.

FIGS. 5 to 7 are views showing a method for fabricating the light conversion member according to the first embodiment. In particular, FIG. 5 is a plan view showing a tube forming device. FIG. 6 is a view showing the procedure of forming the tube through an extrusion scheme. FIG. 7 is a sectional view taken along a length direction of the light conversion member according to the first embodiment. Hereinafter, the method for fabricating the light conversion member will be described by making reference to the above description about the liquid crystal display. In other words, the description about the liquid crystal display will be incorporated in the description about the method for fabricating the light conversion member.

Referring to FIGS. 5 and 6, a tube molding device to form the tube 410 includes a molten bath 40 to receive molten glass. The molten bath 40 is classified into four receiving regions 41, 42, 43, and 44.

The first receiving region 41 receives first molten glass 61, and the second receiving region 42 receives second molten glass (not shown). In addition, the third receiving region 43 receives third molten glass 63, and the fourth receiving region 44 receives fourth molten glass (not shown).

In this case, the second and fourth molten glasses may include color dyes or color pigments.

The first molten glass 61 is extruded through a first extrusion hole 51, and the second molten glass is extruded through a second extrusion hole 52. In addition, the third molten glass 63 is extruded through a third extrusion hole 53, and the fourth molten glass is extruded through a fourth extrusion hole 54.

After the molten glasses extruded through the extrusion holes 51, 52, 53, and 54, respectively are bonded to each other, the molten glasses are stretched downward and cooled, so that a long capillary tube including the incident part 411, the first reflection part 413, the second reflection part 414, and the exit part 412 is formed.

The capillary tube is cut by a desirable length, and one end of the cut capillary tube is sealed to form the tube 410.

The tube 410 may be formed through various schemes except for the extrusion scheme.

Referring to FIG. 7, the light conversion particles 430 are uniformly distributed in a resin composition 441. The resin composition 441 is transparent. The resin composition 411 may have photo-curable property.

Then, internal pressure of the tube 410 is reduced, an inlet of the tube 410 is immersed in the resin composition 441 in which the light conversion particles 430 are distributed, and ambient pressure is increased. Thus, the resin composition 411 having the light conversion particles 430 is introduced into the tube 410.

Thereafter, a part of the resin composition 441 introduced into the tube 410 is removed and the inlet of the tube 410 becomes empty.

Then, the resin composition 441 introduced into the inlet of the tube 410 is cured by UV light so that the host 440 can be formed.

Next, epoxy resin composition is introduced into the inlet of the tube 410. Then, the epoxy resin composition is cured so that the sealing member 420 is formed. The process for forming the sealing member 420 is performed under the nitrogen atmosphere, so the air layer 450 including nitrogen is formed between the sealing member 420 and the host 440.

As described above, the light conversion member 400 including the incident part 411, the first reflection part 413, the second reflection part 414, and the exit part 412 can be manufactured. In other words, the light conversion member 400 representing uniform color reproduction and enhanced brightness can be easily provided.

Figure 8:
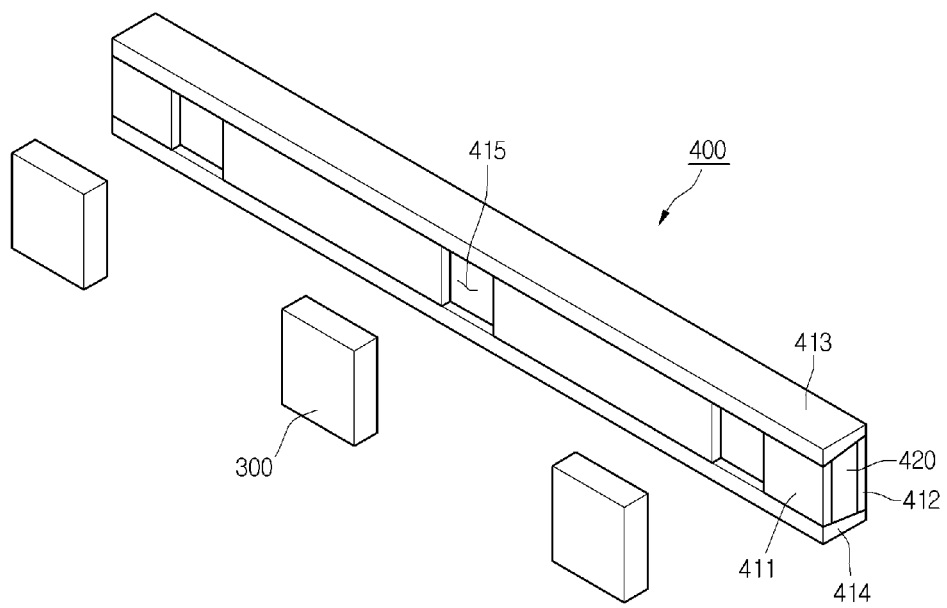
FIG. 8 is a view showing an LED and a light conversion member according to the second embodiment.
Figure 9:
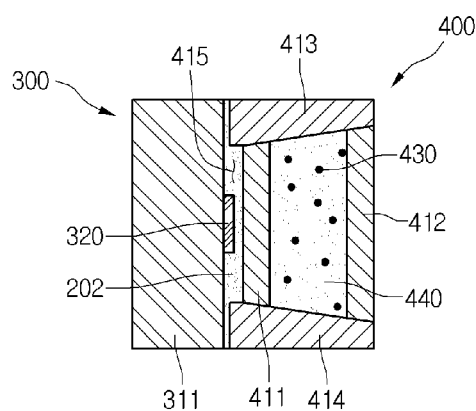
FIG. 9 is a sectional view showing a portion of the LED and the light conversion member according to the second embodiment.

FIG. 8 is a view showing a light emitting diode and a light conversion member according to a second embodiment, and FIG. 9 is a sectional view showing one section of the light emitting diode and the light conversion member according to the second embodiment. Hereinafter, the present embodiment will be described by making reference to the above description about the liquid crystal display, and the light emitting diode and the light conversion member will be additionally described. The description about the previous embodiments will be incorporated in the description about the present embodiment except for modifications.

Referring to FIGS. 8 and 9, the light conversion member 400 is provided therein with grooves 415. In detail, the tube 410 is provided therein with the grooves 415. The grooves 415 correspond to light emitting diodes 300, respectively. The number of the grooves 415 may be equal to the number of the light emitting diodes 300.

In addition, the incident part 411 is provided therein with the grooves 415. The grooves 415 are defined between the first and second reflection parts 413 and 414.

As shown in FIG. 9, the body 311 of the light emitting diode 300 is not provided therein with a cavity. In other words, the light emitting diode chip 320 protrudes out of the body 311.

In addition, the light emitting diode chip 320 may be provided inside the groove 415. In other words, light emitting diode chips 320 corresponding to the grooves 415 and can irradiate light into the groove 415.

In addition, a filling material 202 may be provided between the light emitting diode chip 320 and an inner surface of the groove 415. The filling material 202 may cover the light emitting diode chip 320 and may be filled in the groove 415.

The filling material 202 closely adheres to the light emitting diode chip 320 and the body 311. In addition, the filling material 202 closely adheres to the inner surface of the groove 415.

Therefore, an air layer is not formed between the light emitting diode chip 320 and the light conversion member 400, so that the light emitted from the light emitting diode chip 320 can be effectively incident into the light conversion member 400 by the filling material 202.

In addition, since the light emitting diode chip 320 is provided inside the groove 415, the light emitted from the light emitting diode chip 320 can be effectively incident into the light conversion member 400.

In addition, the groove 415 is defined between the first and second reflection parts 413 and 415. Therefore, even if the light is emitted from the light emitting diode chip 320 with a wide divergence angle, the divergence angle of the light passing through the light conversion member 400 can be easily adjusted by the first and second reflection parts 413 and 414.

Therefore, the liquid crystal display including the light emitting diode 300 and the light conversion member 400 according to the present embodiment can represent uniform color reproduction, enhanced brightness, and enhanced image quality throughout the entire portion of the liquid crystal display Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
a light source;
a filling material surrounding the light source; and
a light conversion member adjacent to the light source, wherein the light conversion member comprises:
a plurality of light conversion particles to convert a wavelength of a light emitted from the light source; and
a sealing member to receive the light conversion particles,
wherein the sealing member comprises:
an incident part facing an exit surface of the light source;
an exit part facing the incident part while the light conversion particles are interposed between the exit part and the incident part; and
a reflection part connected to the incident part and the exit part,
wherein the incident part, the exit part, and the reflection part connect to each other,
wherein the incident part, the exit part, and the reflection part surround the light conversion particles,
wherein the reflection part reflects light which is converted by the light conversion particles and light which is transmitted without conversion by the light conversion particles,
wherein the light conversion particles are distributed in a host,
wherein the incident part has a refractive index different from a refractive index of the exit part, and
wherein the refractive index of the incident part has an intermediate value between the refractive indexes of the filling material and the host.

2. The display device of claim 1, wherein the incident part and the exit part have transmittances higher than transmittance of the reflection part.

3. The display device of claim 1, wherein the reflection part is semitransparent or opaque.

4. The display device of claim 1, wherein the reflection part includes color dyes or color pigments.

5. The display device of claim 4, wherein the color dyes or the color pigments represent white color or blue color.

6. The display device of claim 1, wherein the reflection part has an inclined surface inclined with respect to an optical axis of the light source.

7. The display device of claim 1, wherein the incident part, the exit part, and the reflection part include glass or plastic.

8. The display device of claim 1, wherein the light source emits a blue light, and
wherein the light conversion member converts a part of the blue light into a green light and a red light, and transmits another part of the blue light.

9. A light conversion member comprising:
a sealing member; and
a plurality of light conversion particles in the sealing member,
wherein the sealing member comprises:
an incident part;
an exit part facing the incident part while the light conversion particles are being interposed between the exit part and the incident part; and
a reflection part connected to the incident part and the exit part,
wherein the incident part, the exit part, and the reflection part connect to each other,
wherein the incident part, the exit part, and the reflection part surround the light conversion particles,
wherein the reflection part reflects light which is converted by the light conversion particles and light which is transmitted without conversion by the light conversion particles, and
wherein the incident part has a refractive index different from a refractive index of the exit part.

10. A light conversion member of claim 9, wherein the incident part and the exit part have transmittances higher than transmittance of the reflection part.

11. A light conversion member of claim 9, wherein the reflection part is semitransparent or opaque.

12. A light conversion member of claim 9, wherein the reflection part includes color dyes or color pigments.

13. A light conversion member of claim 12, wherein the color dyes or the color pigments represent white color or blue color.

14. A light conversion member of claim 9, wherein the reflection part has an inclined surface inclined with respect to an optical axis of the light source.

15. A light conversion member of claim 9, wherein the incident part, the exit part, and the reflection part include glass or plastic.

* * * * *